US011727999B2

(12) United States Patent
Pawlowski

(10) Patent No.: US 11,727,999 B2
(45) Date of Patent: *Aug. 15, 2023

(54) ZONE SWAPPING FOR WEAR LEVELING MEMORY

(71) Applicant: Micron Technology, Inc., Boise, ID (US)

(72) Inventor: Joseph T. Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/697,493

(22) Filed: Mar. 17, 2022

(65) Prior Publication Data
US 2022/0208284 A1 Jun. 30, 2022

Related U.S. Application Data

(63) Continuation of application No. 17/144,981, filed on Jan. 8, 2021, now Pat. No. 11,302,410, which is a (Continued)

(51) Int. Cl.
*G11C 7/00* (2006.01)
*G11C 16/34* (2006.01)
(Continued)

(52) U.S. Cl.
CPC ........ *G11C 16/349* (2013.01); *G06F 12/0246* (2013.01); *G06F 12/0292* (2013.01);
(Continued)

(58) Field of Classification Search
CPC ............... G06F 16/349; G06F 12/0246; G06F 12/0292; G06F 12/0873
(Continued)

(56) References Cited

U.S. PATENT DOCUMENTS 6,000,021 A 12/1999 Saito et al.
8,612,804 B1 12/2013 Kang et al.
(Continued)

FOREIGN PATENT DOCUMENTS

CN 101533670 A 9/2009

OTHER PUBLICATIONS

"ISA/KR, International Search Report and Written Opinion of the International Searching Authority, Int'l Appl. No. PCT/US2020/047189, dated Nov. 25, 2020, Korean Intellectual Property Office, Seo-gu, Daejeon, Republic of Korea, 11pgs".
(Continued)

*Primary Examiner* — Vu A Le
(74) *Attorney, Agent, or Firm* — Holland & Hart LLP

(57) ABSTRACT

Methods, systems, and devices related to zone swapping for wear leveling memory are described. A memory device can perform access operations by mapping respective logical zones associated with respective logical addresses (e.g., of an access command) to respective zones of the memory device. As the memory device receives access commands and accesses respective zones, some zones may undergo a disproportionate amount of access operations relative to other zones. Accordingly, the memory device may swap data stored in some disproportionately accessed zones. The memory device can update a correspondence of respective logical zones associated with the zones based on swapping the data so that later access operations access the desired data.

20 Claims, 9 Drawing Sheets

Related U.S. Application Data continuation of application No. 16/555,903, filed on Aug. 29, 2019, now Pat. No. 10,902,929.

(51) Int. Cl.
   *G11C 11/409* (2006.01)
   *G06F 12/02* (2006.01)
   *G06F 13/16* (2006.01)
   *G06F 12/0873* (2016.01)

(52) U.S. Cl.
   CPC ...... *G06F 12/0873* (2013.01); *G06F 13/1668* (2013.01); *G11C 11/409* (2013.01); *G06F 2212/7211* (2013.01)

(58) Field of Classification Search
   USPC .......................................................... 365/205
   See application file for complete search history.

(56) References Cited

U.S. PATENT DOCUMENTS

| | | | |
|---|---|---|---|
| 9,672,905 | B1 | 6/2017 | Gold et al. |
| 2004/0083335 | A1 | 4/2004 | Gonzalez et al. |
| 2009/0138654 | A1 | 5/2009 | Sutardja |
| 2010/0172179 | A1 | 7/2010 | Gorobets et al. |
| 2011/0320688 | A1 | 12/2011 | Lee |
| 2013/0007380 | A1 | 1/2013 | Seekins et al. |
| 2014/0244897 | A1* | 8/2014 | Goss ................... G06F 12/0238 711/103 |
| 2017/0069395 | A1* | 3/2017 | Yao ..................... G06F 12/0246 |
| 2017/0300408 | A1 | 10/2017 | Li et al. |
| 2017/0300423 | A1 | 10/2017 | Kamruzzaman |
| 2019/0196956 | A1 | 6/2019 | Jung et al. |
| 2019/0237150 | A1 | 8/2019 | Jeong et al. |
| 2019/0310780 | A1 | 10/2019 | Gholamipour et al. |

OTHER PUBLICATIONS

Chinese Patent Office, "Office Action and Search Report", issued in connection with Chinese Patent Application No. 202080065729.0 dated Oct. 10, 2022 (24 pages) (12 pages of English Translation and 12 pages of Original Document).

European Patent Office, "Supplementary European search report and Search Opinion", issued in connection with European Patent Application No. 20857250.3 dated Sep. 28, 2022 (8 pages).

* cited by examiner

ZONE SWAPPING FOR WEAR LEVELING MEMORY

CROSS REFERENCE

The present application for patent is a continuation of U.S. patent application Ser. No. 17/144,981 by Pawlowski, entitled "ZONE SWAPPING FOR WEAR LEVELING MEMORY," filed Jan. 8, 2021, which is a continuation of U.S. patent application Ser. No. 16/555,903 by Pawlowski, entitled "ZONE SWAPPING FOR WEAR LEVELING MEMORY," filed Aug. 29, 2019, each of which is assigned to the assignee hereof, and each of which is expressly incorporated by reference in its entirety herein.

BACKGROUND

The following relates generally to a system that includes at least one memory device and more specifically to zone swapping for wear leveling memory.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Improving a computing system may include enhancing a memory subsystem's performance such as reducing power consumption, increasing memory capacity, improving read/write speeds, providing non-volatility by use of persistent memory media, or reducing manufacturing costs at a certain performance point, among other metrics. Some types of memory may have limits with regard to a quantity of access operations (e.g., write operations and/or read operations) that may be performed on each cell without degradation in memory performance. In addition, some patterns of memory accesses may frequency access certain regions of memory. Thus, maintaining memory performance under various conditions, including disproportionate access operations may provide challenges.

DETAILED DESCRIPTION

Figure 1:
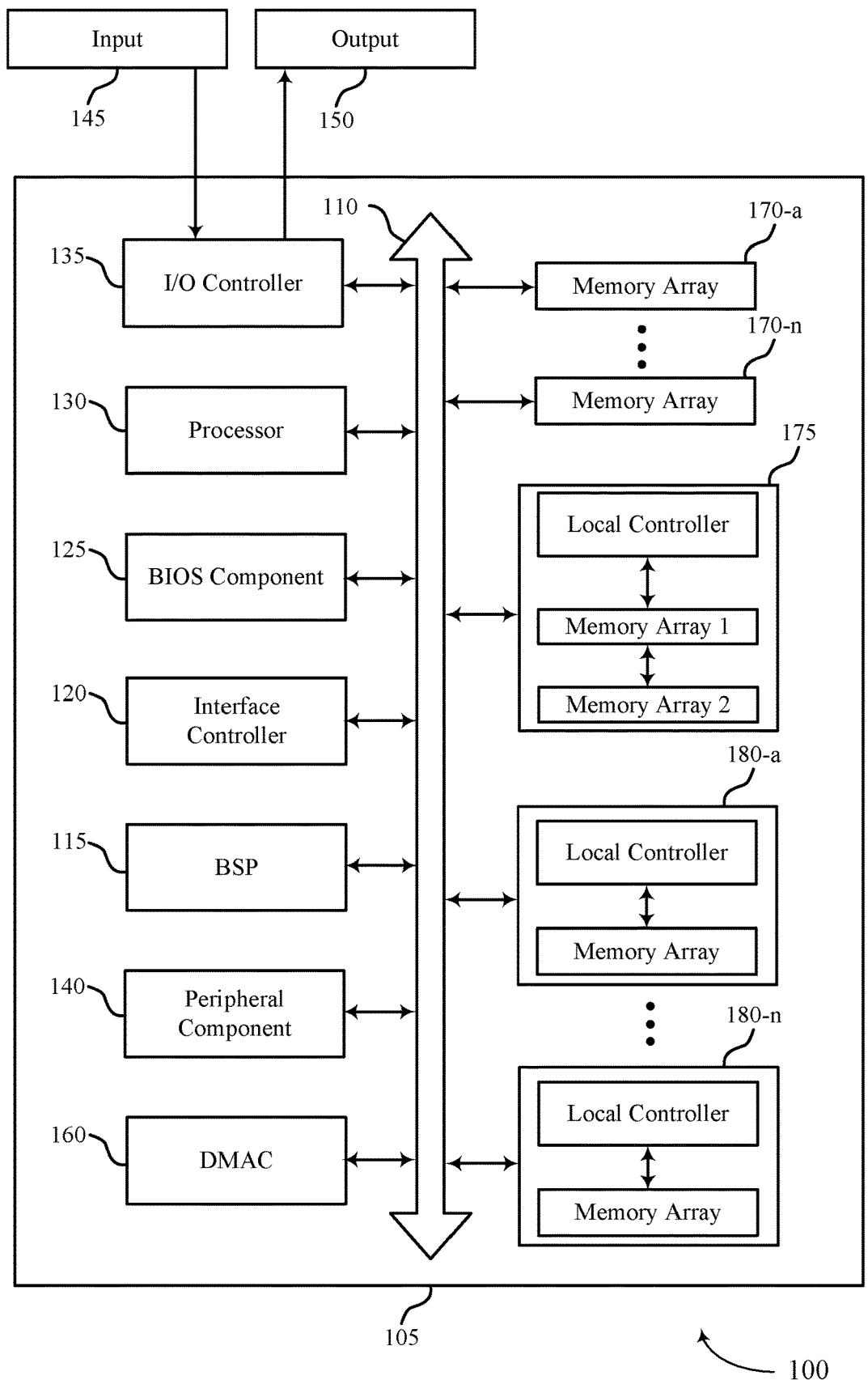
FIG. 1 illustrates an example of a computing system that supports zone swapping for wear leveling memory in accordance with examples as disclosed herein.

Memory cells of a memory device may wear-out or stop reliably storing a memory state when the quantity of access operations (e.g., reads, writes, etc.) of the cells surpasses a wear threshold. In some cases, one or more memory cells may be subjected to a higher concentration of access operations, for example, due to normal operations of a memory device or a malicious attack. Accordingly, some memory cells may wear-out before other, less accessed memory cells of a memory array. As such, logic states stored at those cells may become corrupted, or if identified, a memory device may need to dedicate resources to correcting errors or storing data associated with worn out memory cells.

Memory devices may include one or more logical structures for associating memory addresses with physical memory locations. For example, a memory array may have zones that associate logical addresses with physical locations (e.g., memory cells) of a memory array. A zone can correspond to a particular quantity of data (e.g., a quantity of codewords) and can be divided across multiple memory dies. According to various aspects described herein, a memory device may perform wear leveling operations as part of performing access operations associated with memory cells of one or more zones. For example, each zone may be associated with a value (e.g., a weighted value) that represents a quantity of access operations performed on memory cells within the zone. When the value associated with the zone exceeds a threshold value, the data of the zone can be swapped with data of a zone that has experienced fewer access operations (e.g., a zone with a smaller weighted value). By swapping the data of zones that have experienced greater quantities of access operations with the data of zones that have experienced fewer access operations, zones may be more-uniformly accessed, which may prolong the lifespan of a memory device.

In order to exchange (e.g., swap) data located in different zones, the memory device can include an address translation table (e.g., a zone translation table) that maps an address of an access command (e.g., a logical or virtual address) to a respective zone such that the data associated with the access command can be accessed. In some examples, the zone translation table can track a value (e.g., a weighted value) of each zone that can be associated with the quantity of access operations performed on the respective zone. Accordingly, when a value associated with a zone is undesirably high (e.g., when the value of a zone exceeds a threshold value), the zone may be a candidate for swapping. In some examples, the other candidate for swapping can be a zone that is associated with a lower (or the lowest) weighted value. Data of the two zones can then be swapped. Once the data has been swapped, the memory device can update the zone translation table to reflect the swap. That is, the zone translation table can be updated to reflect a new mapping between the logical address and the new physical location of the data. Accordingly, when subsequent access commands for the swapped data are received, the data can be accessed at its new location. Swapping data based on weighted values of zones as a form of wear leveling can more-evenly distribute access operations across a greater quantity of memory cells of the zone, which can prolong the lifespan of the memory device.

Features of the disclosure are initially described in the context of a computing system and memory subsystem as described with reference to FIGS. 1-3. Features of the disclosure are described in the context of a memory device that supports zone swapping as described with reference to FIGS. 4, 5A, and 5B. These and other features of the disclosure are further illustrated by and described with reference to an apparatus diagram and flowcharts that relate to zone swapping for wear leveling memory as described with references to FIGS. 6-9.

FIG. 1 illustrates an example of a computing system 100 that supports zone swapping for wear leveling memory in accordance with examples of the present disclosure. The computing system 100 may include a device 105. The device 105 may include a processor 130, an interface controller 120, and various memory devices 170, 175, and 180. The memory devices 170, 175, and 180 may be referred to as memory media. The device 105 may also include an input/output controller 135, a basic input/output system (BIOS) component 125, a board support package (BSP) 115, a peripheral component(s) 140, a direct memory access controller (DMAC) 160. The components of the device 105 may be in electronic communication with one another through a bus 110.

The device 105 may be a memory subsystem or memory component, computing device, electronic device, mobile computing device, or wireless device. The device 105 may be a portable electronic device. The device 105 may be a computer, a laptop computer, a tablet computer, a smartphone, a cellular phone, a wearable device, an internet-connected device, or the like. In some cases, the device 105 may be configured for bi-directional wireless communication with one or more other devices.

The processor 130 may be configured to operate with various memory media 170, 175, 180, or any combination thereof, either directly or via the interface controller 120. In some cases, the processor 130 may perform functions of the interface controller 120. The processor 130 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components.

The interface controller 120 may be configured to operate with the processor 130. In some examples, the interface controller 120 may be integrated as a part of the processor 130. The interface controller 120 may also be configured to operate with various memory media 170, 175, 180, or any combination thereof.

The memory media 170 may each include an array or arrays of memory cells to store digital information. The memory media 170 may be configured to operate with the processor 130, the interface controller 120, or both. In some examples, the memory media 170 may be configured to serve as a buffer memory for a memory bank for the processor 130 or the interface controller 120.

The memory media 175 may include a local controller configured to operate with an array of memory cells structured in two or more tiers. The local controller of the memory media 175 may also be configured to operate the processor 130 or the interface controller 120. The local controller of the memory media 175 may be configured to take advantage of different characteristics of memory cells to efficiently operate with the processor 130 or the interface controller 120. In some examples, first-tier memory cells may be 3DXP memory that may provide a high quantity of input/output operations per second (IOPS) with a short response time to handle various workloads. In some examples, second-tier memory cells may be three-dimensional NAND memory that may provide high capacity for data storage at a relatively lower cost than the first-tier memory cells. The memory media 175 may include other types or combinations of memory arrays in some cases.

The memory media 180 may include a local controller configured to operate with an array or arrays of memory cells. The local controller of the memory media 180 may also be configured to operate with the processor 130 or the interface controller 120. In some examples, memory cells may include non-volatile, or volatile memory cells, or a combination of non-volatile and volatile memory cells. In some examples, the local controller of the memory media 180 may be configured to handle a variable page size for a memory array where the memory array includes non-volatile memory cells, e.g., ferroelectric memory cells. In some examples, one or more memory media 180 may be present in device 105. In some examples, the local controllers of the memory media 180 may be configured to manage codewords divided across multiple memory dice where the memory dice include arrays of 3DXP memory cells. In other examples, the processor 130 or the interface controller 120 may be configured to identify weighted values associated with particular zones of the memory media 180. For example, the processor 130 or the interface controller 120 may be configured to determine an amount of access operations associated with one or more zones, which may correspond to a weighted value associated with the respective zones. Based on a respective weighted value exceeding a threshold, the processor 130 or the interface controller 120 may swap data located in two zones. After swapping the data, the processor 130 or the interface controller 120 can update a table (e.g., a scoreboard, a zone translation table) that maps respective logical zones associated with respective logical addresses to respective zones of the memory media 180. Based on updating the zone translation table, swapped data can be accessed at its new location (e.g., its updated location).

The DMAC 160 may enable the processor 130 to perform direct memory accesses with the memory media 170, 175, or 180. For example, the DMAC 160 may support the processor 130 to directly access a memory medium 170, 175, or 180 without the involvement or operation of the interface controller 120.

The peripheral component(s) 140 may be an input or output device, or an interface for such devices, that may be integrated into the device 105. Examples may include a disk controller, a sound controller, a graphics controller, an Ethernet controller, a modem, a universal serial bus (USB) controller, a serial or parallel port, or peripheral card slots, such as peripheral component interconnect (PCI) or accelerated graphics port (AGP) slots. The peripheral component(s) 140 may be other components understood by those skilled in the art as peripherals.

The BIOS component 125 or the BSP 115 may be a software component that includes a basic input/output system (BIOS) operated as firmware, which may initialize and run various hardware components of the computing system 100. The BIOS component 125 or the BSP 115 may also manage data flow between the processor 130 and the various components, e.g., the peripheral components 140, the input/output controller 135. The BIOS component 125 or the BSP 115 may include a program or software stored in read-only memory (ROM), flash memory, or any other non-volatile memory.

The input/output controller 135 may manage data communication between the processor 130 and the peripheral component(s) 140, the input devices 145, or the output devices 150. The input/output controller 135 may also manage external peripherals that are not part of the device 105. In some cases, the input/output controller 135 may represent a physical connection or port to the external peripheral.

The input 145 may represent a device, a signal, or an interface external to the device 105 that provides input to the device 105 or its components. This may include a user interface or interface with or between other devices. In some cases, the input 145 may be a peripheral that interfaces with the device 105 via the peripheral component(s) 140 or may be managed by the input/output controller 135. In some examples, the input 145 may be a host link associated with a host device or a host interface.

The output 150 may represent a device, a signal, or an interface external to the device 105 configured to receive output from the device 105 or any of its components. Examples of the output 150 may include a display, audio speakers, a printing device, or another processor on printed circuit board, etc. In some cases, the output 150 may be a peripheral that interfaces with the device 105 via the peripheral component(s) 140 or may be managed by the input/output controller 135. In some examples, the output 150 may be a host link associated with a host device or a host interface.

The components of the device 105 may include circuitry designed to carry out various functions of the components. This may include various circuit elements, for example, conductive lines, transistors, capacitors, inductors, resistors, amplifiers, or other active or passive elements, configured to carry out the functions of the components described herein.

The device 105, in some examples, may be configured with one or more interface components and may receive an access command or a host request (e.g., through the input 145) from a host device (not shown). The interface components may be configured to be compatible with the Gen-Z or the CCIX protocol, among other examples. The host request (e.g., a read operation, a write operation) may be associated with a host address and the device 105 may generate a second command with an interleaved address based on the information in the host request to parallelize the operation across multiple media ports. In some examples, the device 105 may be configured to generate physical media addresses (e.g., addresses associated with the memory media 170, 175, or 180) with a low latency based on the incoming host addresses. The device 105 may then retrieve the data requested by the host (e.g., when the host request includes a read operation) from the multiple media ports as a result of or based on sending the second command to local controllers associated with the memory media (e.g., the memory media 175 or 180). Subsequently, the device 105 may generate a packet of data to send to the host (e.g., through the output 150) through the interface components in accordance with the protocol associated with the host link.

In some examples, the device 105 can include a table (e.g., a zone translation table) for mapping logical addresses with zones (e.g., physical zones associated with a range of physical addresses) of the memory media 175 or 180. For example, when the device receives an access command or a host request (e.g., through the input 145) from a host device (not shown), the respective data can be accessed using the zone translation table. In some examples, data located in certain zones can be accessed more (e.g., substantially more) than data located in other zones. That is, some zones can be accessed disproportionately relative to other zones.

The device 105 can track a quantity of access operations associated with each zone, which can be represented by a value (e.g., a weighted value). The value can represent a quantity of read operations and/or a quantity of write operations performed on each zone. Because write operations may wear out zones more quickly (e.g., a zone can wear out by experiencing fewer write operations than read operations), write operations performed on a zone can be associated with a greater weighted value. When a zone experiences a high quantity of access operations relative to other zones (e.g., when the zone's weighted value is high), data stored in the zone can be swapped with data stored in another zone. The other zone can, in some examples, be a zone that has experienced a relatively low quantity of access operations. After swapping the data, the zone translation table can be updated so that the data can be accessed at its new (e.g., its updated) location. Swapping data based on a weighted value of an associated zone can distribute access operations across a greater quantity of zones (and memory cells), which can prolong the life of the device 105.

Figure 2:
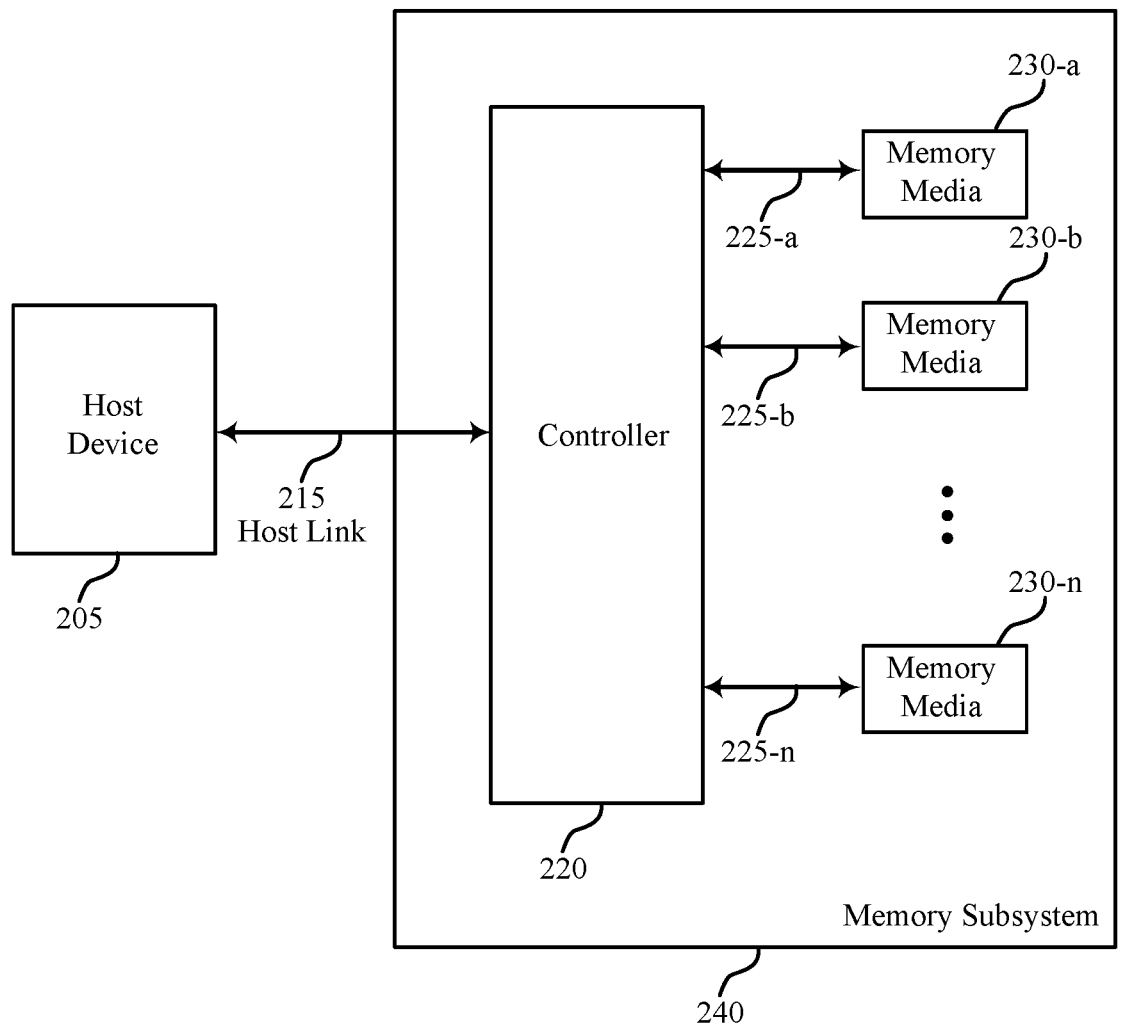
FIG. 2 illustrates an example of a computing system configured with an interface that supports zone swapping for wear leveling memory in accordance with examples as disclosed herein.

FIG. 2 illustrates an example of a computing system 200 configured with an interface that supports zone swapping for wear leveling memory in accordance with various examples of the present disclosure. The computing system 200 may be an example of the computing system 100 described with reference to FIG. 1. The computing system 200 may include a host device 205 coupled with a device 240 through a host link 215. The host device 205 may be a server, a system on a chip (SoC), or a central processing unit (CPU). In some examples, the host device 205 may access (e.g., read from, write to) one or more memory media 230 located in the device 240 through the host link 215. In addition, the host device 205 may set up registers to configure how to access the memory media 230.

The host link 215 may be an example of the input 145, the output 150, or a combination thereof, described with reference to FIG. 1. The host link 215 may employ a protocol (e.g., the Gen-Z, the CCIX protocol). In some examples, the host link 215 may be configured to transfer data at a data transfer rate (e.g., 25 gigabytes per second (GBps)) each direction (e.g., sending or receiving) through the host link. In some examples, a 25 GBps data transfer rate may support 586 million transactions per second when a transaction is 64 bytes. In other examples, a 25 GBps data transfer rate may support 312.5 million transactions per second when a transaction is 128 bytes.

The device 240 may be an example of the device 105 described with reference to FIG. 1. The device 240 may include a controller 220 that may be coupled with memory media 230 through aggregated channels 225. In some examples, the controller 220 and the memory media 230 may be integrated with, in contact with, or placed on a board (e.g., a peripheral component interconnect express (PCIe)

board). In some examples, the device 240 may be referred to as a memory subsystem or a memory component. The controller 220 may include various functional blocks of the device 105 other than the memory media 170, 175, and 180 described with reference to FIG. 1. In some examples, the controller 220 may be an ASIC, a general-purpose processor, other programmable logic device, discrete hardware components, or it may be a combination of these types of components. In some examples, the controller 220 may receive, from the host device 205, a host request (e.g., an access command to read from or write to memory cells in the memory media 230) through the host link 215. In some examples, the controller 220 may generate a command including an interleaved address for the memory media 230 based on information in the host request (e.g., a host address). The interleaved addresses may be associated with the one or more memory media 230.

The controller 220, in some examples, may send the command including the interleaved address to local controllers (e.g., local controllers of the memory media 175 or 180 described with reference to FIG. 1) associated with the memory media 230. In some examples, the controller 220 may read data from or write data at the memory media 230 in conjunction with the local controllers performing various operations (e.g., writing data to memory cells, reading data from memory cells, arranging data in a format compatible with a configuration of the aggregated channels 225). In some examples, the local controllers may send requested data to the controller 220 through the aggregated channels 225. In some examples, the local controllers may send an indication of successful writing of data in response to receiving the command (e.g., a write command). In some examples, the controller 220 may store data received from the local controllers at cache memory. In some examples, the controller 220 may assemble data packages containing contents of the memory media 230 to a consumable form that the host device 205 may use. The controller 220 may send the data packages to the host device 205 through the host link 215 in accordance with the interface protocol (e.g., the Gen-Z, the CCIX protocol).

As discussed with reference to the processor 130 or the interface controller 120 of FIG. 1, the controller 220 may be configured to identify weighted values associated with particular zones of the memory media 230. For example, the controller 220 may be configured to determine an amount of access operations associated with one or more zones, which may correspond to a weighted value associated with the respective zones. Based on a respective weighted value exceeding a threshold, the controller 220 may swap data located in two zones. After swapping the data, the controller 220 can update a zone translation table that maps respective logical zones associated with respective logical addresses to respective zones of the memory media 230. Based on updating the zone translation table, swapped data can be accessed at its new location (e.g., its updated location).

An individual memory medium (e.g., the memory medium 230-*a*) of the memory media 230, in some examples, may include multiple memory dice (e.g., sixteen memory dice) to obtain a desired memory capacity. Each memory die may include the local controller (e.g., local controllers of the memory media 175 or 180 described with reference to FIG. 1) to collaborate with the controller 220 and to manage various memory operations within the memory die. In addition, the multiple memory dice within the individual memory medium may operate in parallel to generate a desired aggregated data transfer rate.

In some examples, the memory dice may include non-volatile memory cells (e.g., 3DXP array of phase change memory cells). In other examples, the memory dice may include non-volatile memory cells including a chalcogenide alloy. In some examples, a codeword or unit of data (e.g., 128 bytes) may be divided across the multiple memory dice within the memory medium (e.g., the memory medium 230-*a*). The aggregated channels 225 may be configured to transport data between the controller 220 and the memory media 230 (e.g., the local controllers). In some examples, each of the aggregated channels 225 (e.g., the aggregated channel 225-*a*) may include a first quantity (e.g., eight) of logical channels for data transport. In some examples, each aggregated channel of the aggregated channels 225 (e.g., the aggregated channel 225-*a*) may include additional channels to carry information related to various auxiliary functions such as error-correction code (ECC) or metadata.

Figure 3:
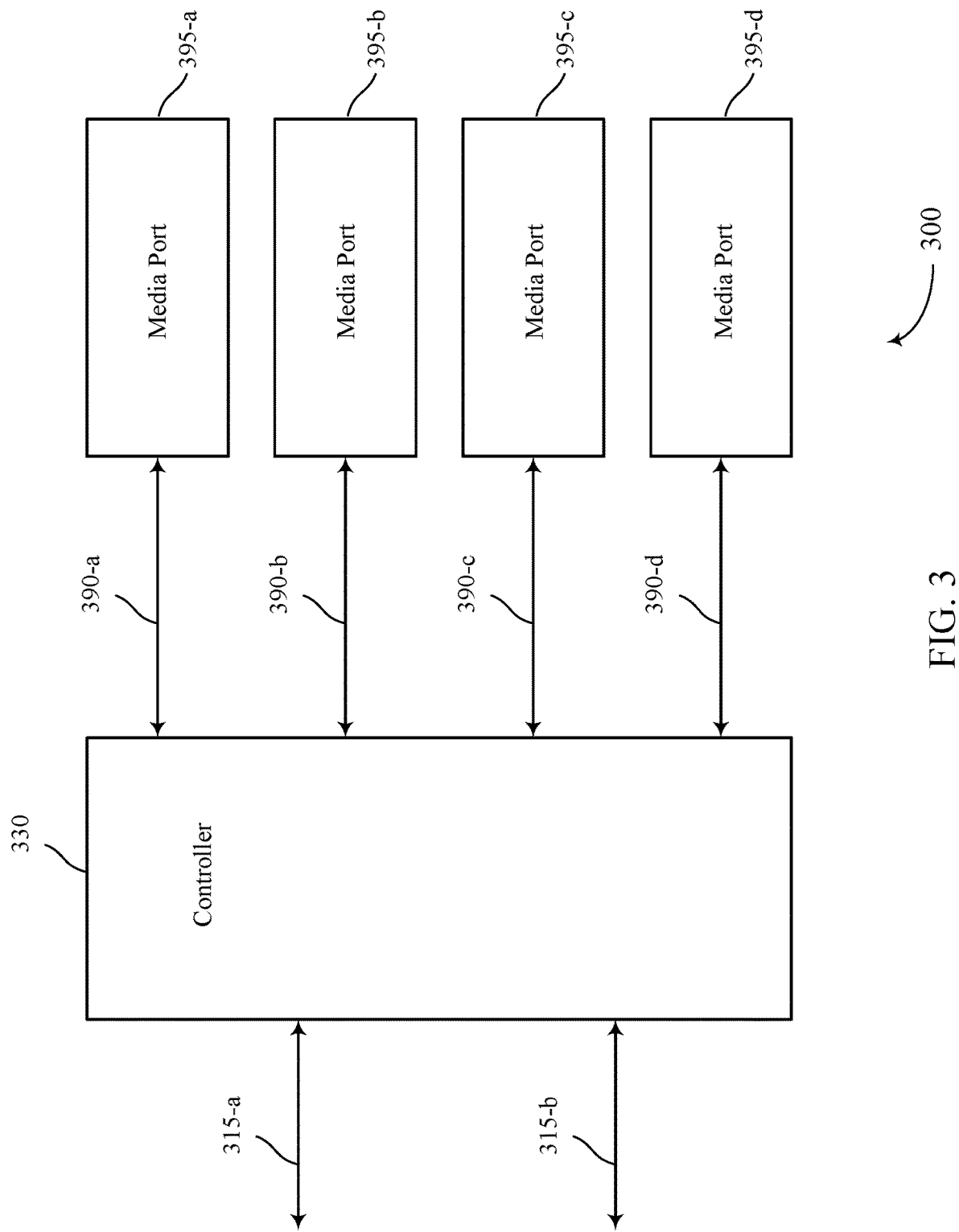
FIG. 3 illustrates an example of a memory subsystem that supports zone swapping for wear leveling memory in accordance with examples as disclosed herein.

FIG. 3 illustrates an example of a memory subsystem 300 that supports zone swapping for wear leveling memory in accordance with examples as disclosed herein. The memory subsystem 300 may be an example of the device 105 or the device 240 as described with reference to FIGS. 1 and 2. The memory subsystem 300 may include one or more host links 315, a controller 330, and one or more media ports 395. The host links 315 and the media ports 395. The controller 330 may be an example of the processor 130 or the controller 220 as described with reference to FIGS. 1 and 2.

The controller 330 and the media ports 395 may exchange data through aggregated channels 390. The aggregated channels 390 may be configured to support a data transfer rate (e.g., 12.8 GBps). In some examples, each media port of the media ports 395 (e.g., the media port 395-*a*) may be configured to have a memory capacity (e.g., 512 gigabytes). In some examples, each media port of the media ports 395 (e.g., the media port 595-*a*) may be configured to include a quantity of zones (e.g., 256×1,024 zones). In some examples, each zone of the quantity of zones may be configured to store a quantity of codewords (e.g., 16,384 codewords) in which each codeword may be 128 bytes large. In some examples, the quantity of zones in a media port may be fixed (e.g., 256×1,024 zones) and the size of codeword may be fixed (e.g., 128 bytes). A quantity of codewords that may be stored in each zone of the quantity of zones (e.g., 256×1,024 zones) of a media port may be determined based on a particular memory capacity of the media port.

Various addressing schemes may be utilized during operations of the memory subsystem 300. The following description illustrates an example of how the memory subsystem 300 depicted in FIG. 3 (e.g., the controller 330 coupled with four media ports 395, each media port configured with 512 gigabyte memory capacity) may operate with the various addressing schemes using a pure byte address form. Actual address form that may be implemented in the memory subsystem 300 may vary from the pure byte address form because various link interface protocols associated with the host links 315 may have different levels of truncation of addresses. For example, the Gen-Z protocol may have different truncation of addresses when compared to the CCIX protocol.

The memory subsystem 300 may receive, from a host device (not shown), a request associated with a host address. The host device may identify an allowable address range by reading registers on the controller 330 in the memory subsystem 300. As a way of example, the memory subsystem 300 may support a memory capacity of two terabytes (e.g., 512 gigabytes in each media port 395-*a*, 395-*b*, 395*c*, and 395-*d*). Two terabytes of memory capacity may be represented by addresses having 41 bits (e.g., A40 . . . A0, where A40 . . . A0 may represent a series of forty-one 0s and 1s in which A40 is the most significant bit (e.g., the 41st bit of the series of forty-one 0s and 1s) and A0 the least significant bit (e.g., the first bit of the series of forty-one 0s and 1s)).

For example, the host address may be associated with the addressing scheme having forty-one bits and may be considered as a sequential address. The lowest seven bits (e.g., A6 . . . A0) among forty-one bits may be allocated to designate one of 128 addresses within each codeword of 128 bytes. A codeword may be the smallest unit of data that the memory subsystem 300 may control (e.g., a granularity of 128 bytes). The next 2 bits of the 41 bits (e.g., A8 . . . A7) may be allocated to designate one of the four media ports. Remaining portion of the 41-bits host address (i.e., 32 bits of A40 . . . A9 out of A40 . . . A0) may be presented to each port (one of four media ports) and considered as a port logical address (PLA). It should be appreciated that once the logical address of the media port is determined, the addresses associated with PLA designates address spaces corresponding to one of the four media ports. Hence the port logical address may be considered as interleaved addresses across four media ports.

Each media port may be divided into a plurality of zones (e.g., 256×1,024 zones, or 262,144 zones). Memory capacity of each zone (e.g., 2 megabytes, or 2,097,152 bytes) of the plurality of zones may be further divided by a codeword size (e.g., 128 bytes) to determine a quantity of codewords that may be stored with each zone (e.g., 16,384 codewords of 128 bytes in each zone). The plurality of zones may facilitate a wear-leveling operation. For example, zones can be selected for a wear-leveling operation based on an associated weighted value. As discussed herein, a weighted value can represent a quantity of access operations (e.g., a sum of read operations and write operations) performed on the codewords of the zone. As some zones experience a greater quantity of access operations than other zones, data from the zones associated with higher quantities of access operations may be exchanged (e.g., swapped) with data from zones associated with fewer access operations. Mapping between a logical address and physical location (e.g., a physical address of a media port 395) can be updated based on the data being swapped.

The zone swapping and other supporting functions for the wear-leveling operation may be tracked by a zone translation table in a mapping component (e.g., the mapping component 405 described with reference to FIG. 4). In some examples, the zone translation table may be implemented in SRAM, and may be or include a content addressable memory (CAM). An 18-bit address contained in the zone translation table may provide a lookup address to indicate a particular destination zone associated with the host request. In other examples, the zone translation table can include a 50-bit field that represents the weighted value of a respective zone. For example, the 50-bits can represent a summation of the weighted access operations (e.g., read operations, write operations) performed on the codewords in the zone, which may correspond to the amount of stress experienced by the zone. The bit count of the weight field of the zone translation table can indicate a maximum possible weight value associated with the zone. As discussed herein, zones being associated with relatively larger weighted values can be candidates for a wear-leveling operation. That is, data stored in a zone having a relatively high weighted value can be swapped with data from another zone (e.g., a zone having a relatively low weighted value). Based on the data being swapped, the zone translation table can provide a lookup address to indicate the updated destination zone (e.g., the updated physical location) associated with a host request.

In some examples, the mapping component 405 can manage (e.g., track) various parameters of the memory device. Each parameter can be associated with a particular quantity of bits. For example, the mapping component 405 can translate addresses as described herein, manage weighted values associated with various zones, track the codeword in a zone that includes the highest quantity of write cycles, track timing of when codewords of a zone are accessed, and manage error correction. In some examples, address translation can be associated with 18-bits, managing weighted values can be associated with 50-bits, tracking codewords that include the highest quantity of write-cycles can be associated with 6-bits, tracking timing of when codewords of a zone are accessed can be associated with 17-bits, and error correction can be associated with 16-bits.

Figure 4:
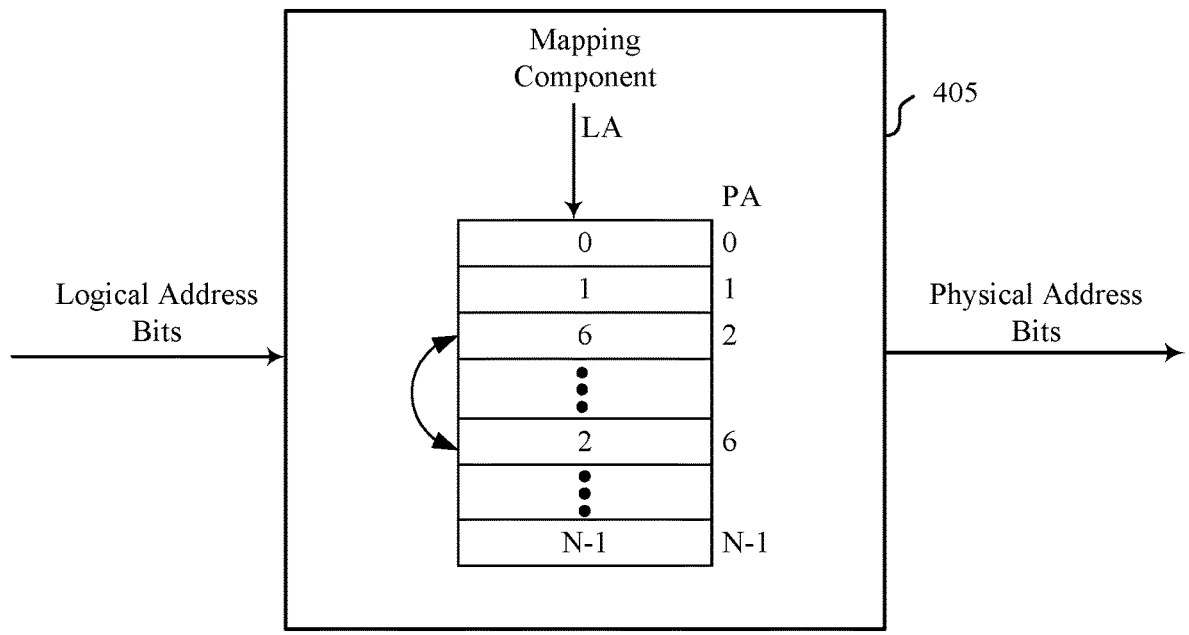
FIG. 4 illustrates an example of a device that supports zone swapping for wear leveling memory in accordance with examples disclosed herein.

FIG. 4 illustrates an example of a memory device 400 that supports zone swapping for wear leveling memory in accordance with examples as disclosed herein. In some examples, the memory device 400 illustrates a portion of a memory sub-system configured to map respective logical zones associated with respective logical addresses (e.g., LAs) to respective zones (e.g., physical zones) of a memory array. The mapping can be performed by a mapping component 405, which can be an example of a zone translation table as described herein. In some examples, mapping respective logical zones associated with respective logical addresses to respective zones of the memory array can include performing logic operations or functions on each bit of the logical address (the logical address bits) to determine a corresponding physical address (corresponding physical address bits).

As shown in FIG. 4, the mapping component 405 may output physical address bits. The physical address bits may designate physical addresses (e.g., PAs) of one or more zones (e.g., PA 0, 1, 2, 6, N−1 as shown in FIG. 4). As discussed with reference to FIG. 3, each zone can be associated with a particular memory capacity (e.g., 2 megabytes, or 2,097,152 bytes), and each zone can be further divided by a codeword size (e.g., 128 bytes). Thus each zone can include, for example, 16,384 codewords of 128 bytes in each zone. The plurality of zones may facilitate a wear-leveling operation. For example, zones can be selected for a wear-leveling operation based on an associated weighted value. In some examples, the mapping component 405 can maintain (e.g., track) a weighted value associated with each of the zones. In other examples, each zone can be configured to maintain its respective weighted value and communicate the respective weighted value to the mapping component 405.

As discussed herein, a weighted value can represent a quantity of access operations (e.g., a sum of read operations and write operations) performed on the codewords of the zone. Thus, when a difference between weighted values of particular zones becomes undesirably high, it may be beneficial to swap the data stored in the zones. When the data is swapped, the mapping component 405 can update the mapping between the logical address bits and the physical address bits (e.g., the physical location) of the swapped data.

In some examples, the mapping component 405 can update the mapping between logical address bits and the physical address bits of swapped data. That is, when data is swapped during a wear leveling operation, the mapping component 405 can update mapping associated with the data such that the data can be accessed in its new (e.g., its updated) location. By way of example, the mapping component 405 may map the logical address 0 to the physical address 0, the logical address 1 to the physical address 1, the logical address 2 to the physical address 2, up to the logical address N−1 to the physical address N−1. Based on a zone swap operation, one or more physical addresses can be mapped to different logical addresses.

For example, as illustrated in FIG. 4, a zone swapping operation can result in data in the third zone (e.g., associated with PA 2) being accessed based on the mapping component 405 receiving logical address bits corresponding to the sixth zone (e.g., associated with LA 6), and subsequently accessing the third zone based on a mapping between the logical address bits and the physical address bits. In some examples, during the zone swapping operation, data stored in the third zone can be swapped with data in the sixth zone. Accordingly, the mapping component 405 can update the mapping between the logical address bits and the physical address bits of the data, such that the data is accessed in the sixth zone when an associated access command is received. In addition, the zone swapping operation may result in data in the seventh zone (e.g., associated with PA 6) being accessed based on the mapping component 405 receiving logical address bits corresponding to the third zone (e.g., associated with LA 2). Swapping data based on weighted values of zones as a form of wear leveling can more-evenly distribute access operations across a greater quantity of memory cells of the zone, which can prolong the lifespan of the memory device.

Figure 5A:
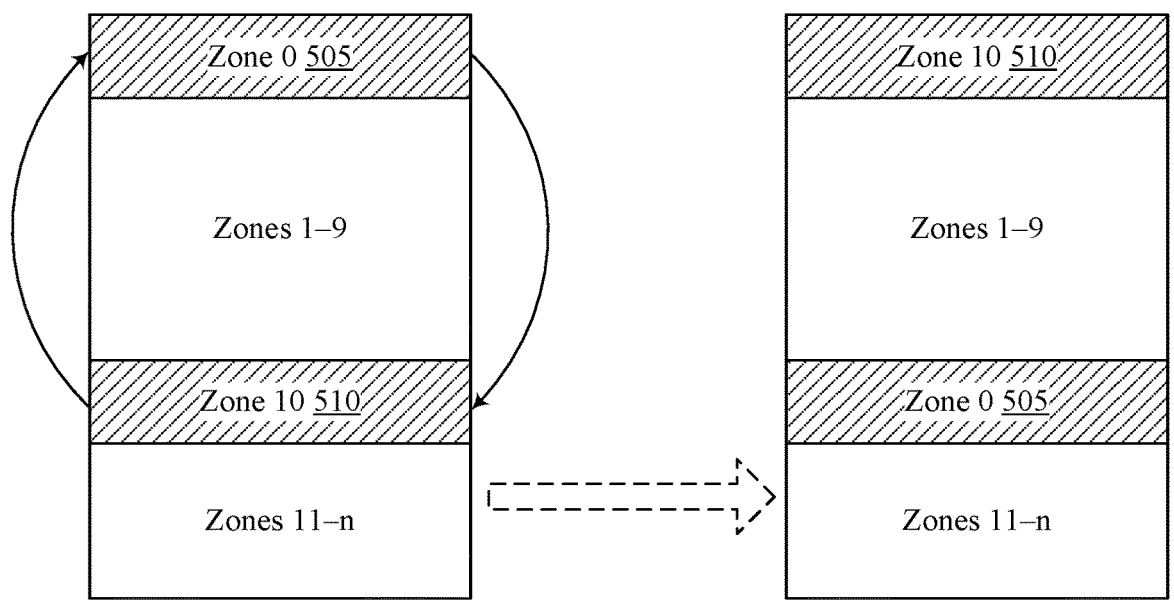
FIGS. 5A and 5B show diagrams illustrating a zone swapping operation that supports zone swapping for wear leveling memory in accordance with examples as disclosed herein.

FIG. 5A illustrates an example of a zone swapping operation 500-*a* that supports zone swapping for wear leveling memory in accordance with examples as disclosed herein. In some examples, the zone swapping operation 500-*a* illustrates data being swapped between two zones. The zones can be examples of zones located within media ports as described with reference to FIG. 3. For example, each media port may be divided into a plurality of zones (e.g., 256×1,024 zones, or 262,144 zones), and each zone can be associated with a predefined capacity (e.g., 2 megabytes, or 2,097,152 bytes). Accordingly, FIG. 5A may illustrate each of the zones of a single media port (e.g., n can be equal to 262,144). Any two zones can be swapped during a single zone swapping operation, although the discussion FIG. 5A focuses on swapping data associated with a first zone 505 (e.g., zone 0) and a second zone 510 (e.g., zone 10).

In some examples, a zone swapping operation may occur between the first zone 505 and the second zone 510 based on a weighted value associated with either or both of the zones. As discussed herein, a weighted value associated with a zone can be based on a quantity of access operations associated with the respective zone. Because write operations may affect a zone differently, write operations can result in a zone being associated with a higher weighted value. That is, a zone may be susceptible to wear-out after experiencing a fewer quantity of write operations than read operations. Accordingly, write operations can be associated with a greater weighted value (e.g., a multiple) than read operations.

Each zone (e.g., zone 505 and/or zone 510) can include multiple codewords. For example, a single zone can include 16,384 codewords of 128 bytes in each zone. Because access operations can be associated with codewords (e.g., an access operation can access one or more codewords), a weighed value associated with each zone can be based on a quantity of access operations of codewords within the zone. To determine a weighted value associated with an entire zone (e.g., zone 505 and/or zone 510) weights (e.g., a multiplier) can be assigned to read operations and write operations. In some examples, the weight assigned to write operations may be greater than the weight assigned to read operations, due to write operations affecting the endurance of the memory device more greatly than read operations. After assigning a weight to the read and write operations, the weighted value may be adjusted by the weight of the operations as the commands are received and processed. As discussed herein, when a difference between a weighted value of two zones exceeds a predefined value (e.g., a threshold), a zone swapping operation can be performed on the respective zones.

In some examples, a zone swapping operation may be performed based on a difference between the weighted values of two zones exceeding a threshold value. For example, a zone that is associated with a greatest weighted value and a zone that is associated with a lowest weighted value may be determined (e.g., periodically or after a certain quantity of access operations). In the event that the difference in the weighted values of the two zones exceeds the threshold value, data associated with the two zones can be swapped. When data stored in the zones are swapped, a mapping component (e.g., the mapping component 405 as discussed with reference to FIG. 4) can update the mapping between the logical address bits and the physical address bits of the data, such that the data can be accessed in the updated zones.

For example, FIG. 5A illustrates the first zone 505 being swapped with the second zone 510. In some examples, a weighted value of each zone (e.g., zones 0 through n) could have been stored as part of a zone translation table. In such an example, a swap could occur between the first zone 505 and the second zone 510 based on a difference between the weighted values. That is, the weighted value of the first zone 505 could be the highest value of any of the zones (e.g., zones 0 through n) and the weighted value of the second zone 510 could be the lowest value of any of the zones (e.g., zones 0 through n). Swapping zones having a highest and lowest weighted value may occur to swap zones that have experienced a greatest and least quantity of read and/or write operations. As discussed herein, swapping data based on weighted values of zones as a form of wear leveling can more-evenly distribute access operations across a greater quantity of memory cells of the zone, which can prolong the lifespan of the memory device.

An opportunity to perform a zone swapping operation can occur at predetermined time intervals or after a predetermined quantity of access operations. For example, an acceptable amount of overhead may be determined for zone swapping, an a time interval or quantity of access operations may be determined such that zone swapping will occupy less than the determined amount of overhead. During a zone swapping opportunity, a zone swap may not necessarily occur. As discussed herein, the determination can be based on a difference between two weighted values satisfying a threshold value. In some examples, the threshold value can be set using a programmable value (e.g., k). For example, a swap can occur when highest weighted value exceeds the value of the lightest weighted value multiplied by k (e.g., heavier weight>lighter weight*k). The value of k can be programmable and can be selected to constrain the weighted values of zones. That is, k can be selected to ensure that the weighted values of zones are relatively close, yet still reflect a quantity of access operations performed on the zone.

For example, k can be selected to ensure that the greater weight never exceeds the lighter weight by a value of k (e.g., k=1.1053). In some examples, k may depend on a quantity of transactions performed on the device. For example, k can begin at a relatively high value (e.g., 10 or 100) when a small quantity of transactions have been performed on the device. As the quantity of transactions increase, k can be incrementally lowered towards k=1. As the quantity of transactions performed on the device increases, lowering k proportionally can ensure that the weighted values of the zones are constrained to a range (e.g., between 0.95 and 1.05 times the average zone weight).

In some examples, zones may be swapped based on the zones not having been swapped for a previously quantity (e.g., or time) of swap operations. For example, zones may be susceptible to being consistently swapped if data traffic is predominately to other zones during a time interval between zone swapping opportunities. That is, applying solely the k value may lead to the next zone swapping opportunity merely undoing a previous zone swap. Accordingly, in some examples, a value (e.g., N) may be assigned (e.g., or configured) to ensure that zones are not swapped repeatedly. In some examples, N can be associated with a time duration, a quantity of access operations, a quantity of swap opportunities, or a quantity of swap operations. For example, N may be set to a quantity of swap operations, and swapping of a pair of zones may be conditioned on the zones not having been the object of a swap for the past N swap pairings. That is, after the data in the first zone 505 and the second zone 510 is swapped, the first zone 505 and the second zone 510 may be ineligible for a swap operation for a N swap pairings. After N swap pairings have been performed zones 505 and 510 may become eligible for a subsequent swapping operation.

In some cases, a list of zones (e.g., ten (10) zones) having the highest weighted value and a list of zones (e.g., ten (10) zones) having the lowest weighted value may be determined. The zone with the highest overall weight may be swapped with the zone having the lowest overall weight, or zones may be randomly (e.g., pseudo-randomly) selected from the lists. In some cases, the zones to be swapped from the lists may be determined based on recent zone swaps (e.g., the last N swap pairings) and the zone swapping criteria (e.g., heavier weight>lighter weight*k). If the zones having the highest and lowest overall weights are ineligible for swapping, one of several options may be used for selecting the zones to be swapped. For example, the zone with the highest overall weight may be swapped with the zone having the second lowest weight, the zone with the lowest weight may be swapped with the zone having the second highest weight, or the zones with the highest and lowest weights that are not among the most recent N swap pairings may be selected for swapping. Each of these options may be conditioned on the zones being swapped satisfying the zone swapping criteria (e.g., heavier weight>lighter weight*k), and more than one option may be applied. For example, if the zones having the highest and lowest overall weights are ineligible for swapping, the zone with the next highest weighted value may be tested according to the zone swapping criteria against the lowest or next lowest weighted value. If no other zone pairing satisfies the zone swapping criteria, no swapping may be performed for that zone swapping opportunity.

Additionally or alternatively, random (e.g., pseudo-random) zone selection may be included. For example, if the zones having the highest and lowest overall weights are ineligible for swapping, zones may be randomly selected from the list of zones having the highest weighted value and the list of zones having the lowest weighted value. In some examples, random selection of zone swapping may be included either periodically (e.g., every certain quantity of swaps), or for selection among the list of zones having the highest weighted value and the list of zones having the lowest weighted value at each swap opportunity, or at swap opportunities when the zones having the highest and lowest weighted values are ineligible. Random zone selection may, for example, prevent intentional memory damage or corruption.

Figure 5B:
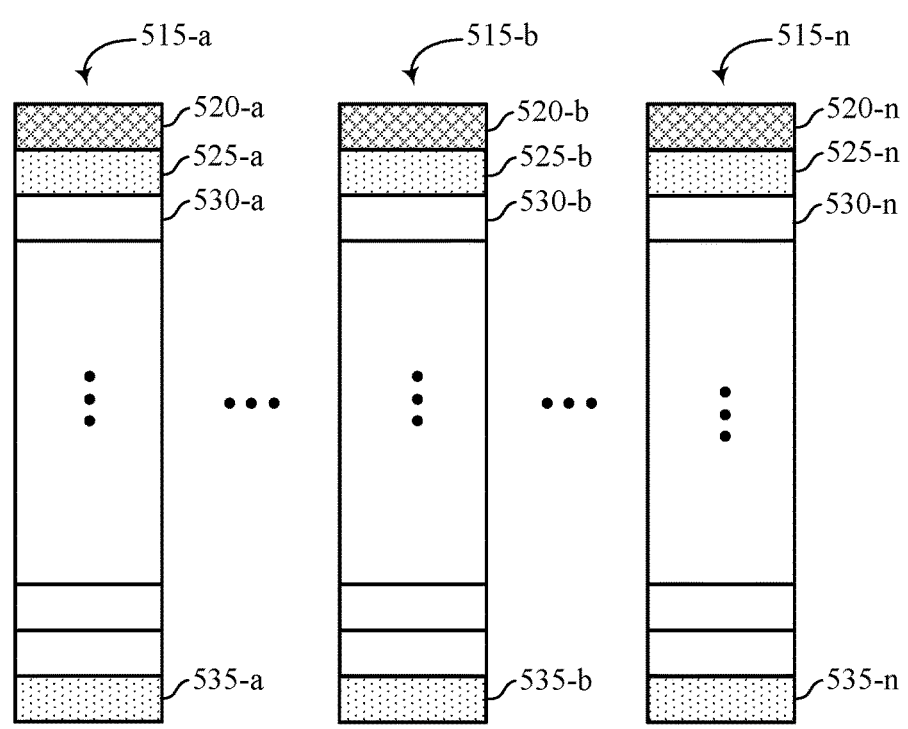

FIG. 5B illustrates a diagram 500-b illustrating example zones that support zone swapping for wear leveling memory in accordance with examples as disclosed herein. The diagram 500-b illustrates various zones in a media port (e.g., zones 515-a, 515-b, 515-n) having N physical address locations and configured to store N codewords. Addresses within each zone are illustrated with the first codeword address (e.g., address 520), the second codeword address (e.g., address 525), the third codeword address (e.g., address 530), and the N codeword address (e.g., address 535). In some examples, N may correspond to 16,384 and each codeword may be 128 bytes.

In some examples, the memory device described herein may include a controller (e.g., a controller 220 as described with reference to FIG. 2) that operates in conjunction with a mapping component (e.g., a mapping component 405 as described with reference to FIG. 4). The controller, when an access command for accessing a codeword associated with a physical address is received, may identify a physical codeword address to store contents of the codeword (e.g., when the host request includes a write operation). For example, data associated with the access command can be stored at the address 520. In some examples, each time a codeword associated with a physical address (e.g., address 520) is accessed, a weighted value associated with the zone can be updated. As described herein, a weighted value associated with a zone (e.g., zone 515-a) can be calculated based on the sum of a weighted value of each codeword address.

As described with reference to FIG. 5A, data stored in two zones may be swapped based on a weighted value associated with a zone exceeding a threshold value. When two zones are swapped, data stored at each address of the zone can be swapped with corresponding data of another zone. That is, data stored in a first address of a first zone may be swapped with data stored in a first address of a second zone and so on. Once all of the data has been swapped, a mapping component (e.g., the mapping component 405 as discussed with reference to FIG. 4) can update the mapping between the logical address bits and the physical address bits of the data, such that the data can be accessed in the updated zones.

By way of example, the zone 515-a can be an example of the first zone 505 as described with reference to FIG. 5A, and the zone 515-b can be an example of the second zone 510 as described with reference to FIG. 5A. Accordingly, the two zones may undergo a zone swapping operation based on the weighted value of one of the zones. To swap the zones, data may be swapped in pairs. For example, data stored at the address 520-a of the first zone 515-a can be swapped with data stored at the address 520-b of the second zone 515-b. In some examples, the data may be temporarily stored in memory of the memory device while it is being swapped. That is, the data can be held in temporary registers so that any reference to the data (e.g., in an access command) can be referenced while the data is being swapped. This process can continue so that data stored at each address of the first zone 515-a (e.g., addresses 520-a, 525-a, 530-a) is swapped with data stored at each address of the second zone 515-b (e.g., addresses 520-b, 525-b, 530-b). After the data is swapped, the mapping between the associated logical addresses and physical location of the data can be updated. Swapping the data in such a manner (and updating the associated mapping accordingly) can enable the memory device to prolong the lifespan of zones without unduly tying up the memory system during data swap operations.

The wear-leveling operation illustrated above may, in some examples, be concurrently executed for different media ports (e.g., the media port 395-*a* through the media port 395-*d* as described with reference to FIG. 3) due to a completely separate port logic algorithm. Thus, the memory device may maintain the host address without any discontinuity despite the quantity of memory media ports.

Figure 6:
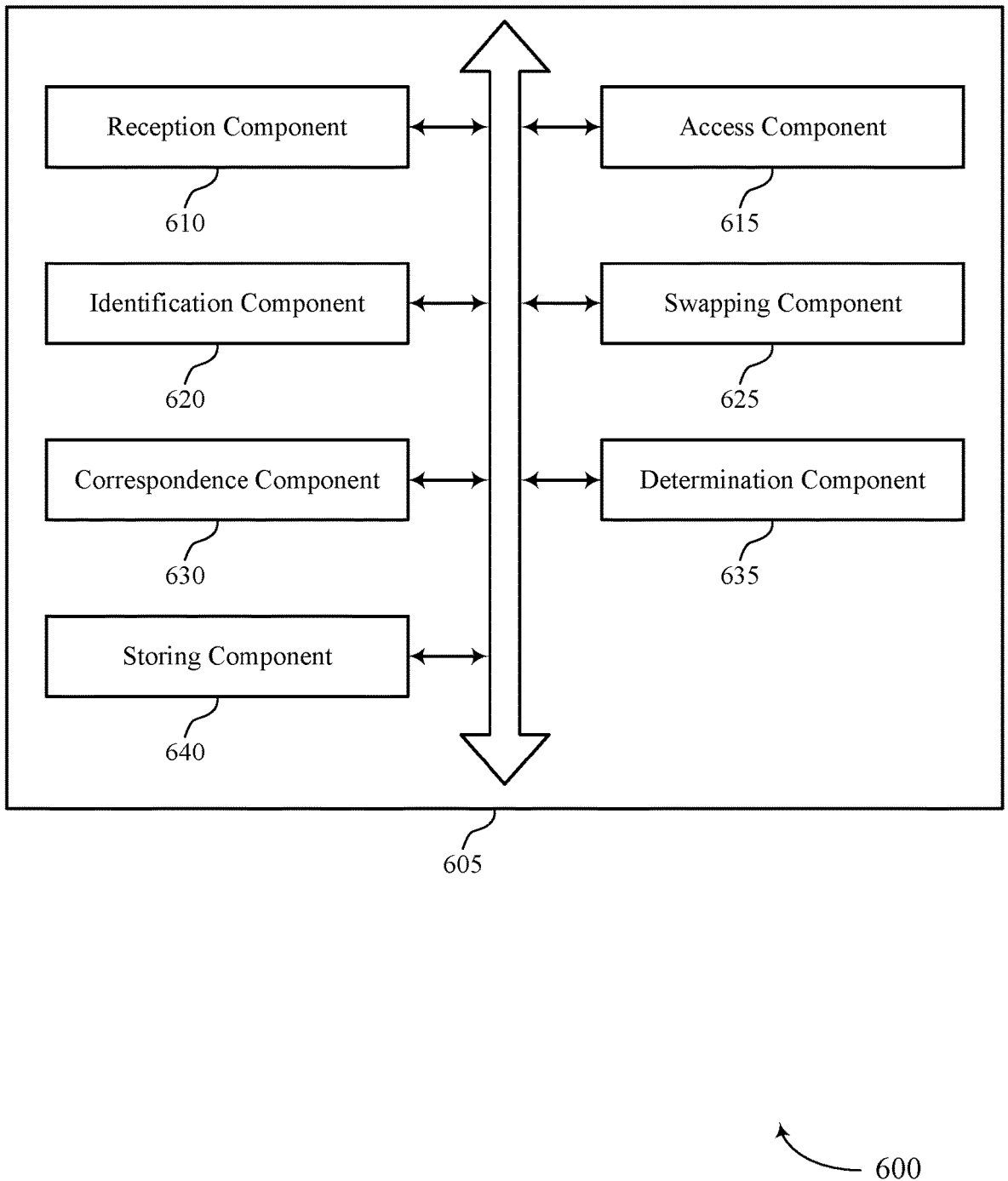
FIG. 6 shows a block diagram of a memory device that supports zone swapping for wear leveling memory in accordance with aspects of the present disclosure.

FIG. 6 shows a block diagram 600 of a memory device 605 that supports zone swapping for wear leveling memory in accordance with examples as disclosed herein. The memory device 605 may be an example of aspects of a memory device as described with reference to FIGS. 3, 4A, and 4B. The memory device 605 may include a reception component 610, an access component 615, an identification component 620, a swapping component 625, a correspondence component 630, a determination component 635, and a storing component 640. Each of these modules may communicate, directly or indirectly, with one another (e.g., via one or more buses).

The reception component 610 may receive, at a memory array including a set of zones, a set of access commands including respective logical addresses.

The access component 615 may perform access operations for the set of access commands based on mapping respective logical zones associated with the respective logical addresses to respective zones of the set of zones of the memory array. In some cases, a read operation performed on a code word of a respective zone is associated with a smaller weighted value than a write operation performed on the respective zone. In some cases, the first zone includes a greater weighted value than the second zone.

The identification component 620 may identify, based on receiving the set of access commands, a first zone that is associated with a first weighted value and a second zone that is associated with a second weighted value, the first weighted value and the second weighted value based on a quantity of the access operations performed on the respective zone.

The swapping component 625 may swap data stored in the first zone and the second zone based on the first weighted value and the second weighted value. In some examples, the swapping component 625 may prohibit swapping data in the first zone and the second zone for a duration based on updating the correspondence of the respective logical zones associated with the first zone and the second zone. In some cases, each of the set of zones includes a set of code words, the respective weighted value of each zone being updated based on access operations of the set of code words of each of the set of zones.

The correspondence component 630 may update a correspondence of respective logical zones associated with the first zone and the second zone based on swapping the data. In some examples, the correspondence component 630 may map the logical zone previously associated with the first zone to the second zone. In some examples, the correspondence component 630 may map the logical zone previously associated with the second zone to the first zone.

The determination component 635 may determine a weighted value associated with each of the set of zones of the memory array, where identifying the first zone associated with the first weighted value and the second zone associated with the second weighted value is based on determining the weighted values associated with each of the set of zones of the memory array. In some examples, the determination component 635 may determine that the first zone is associated with a greatest weighted value of each of the set of zones and the second zone is associated with a smallest weighted value of each of the set of zones. In some examples, the determination component 635 may determine that a difference between the first weighted value and the second weighted value exceeds a threshold value, where swapping the data stored in the first zone and the second zone is based on the difference between the first weighted value and the second weighted value exceeding the threshold value.

The storing component 640 may store the data to a temporary register of the memory array during the swapping, where the data is configured to be accessed in the temporary register until the swapping is complete.

Figure 7:
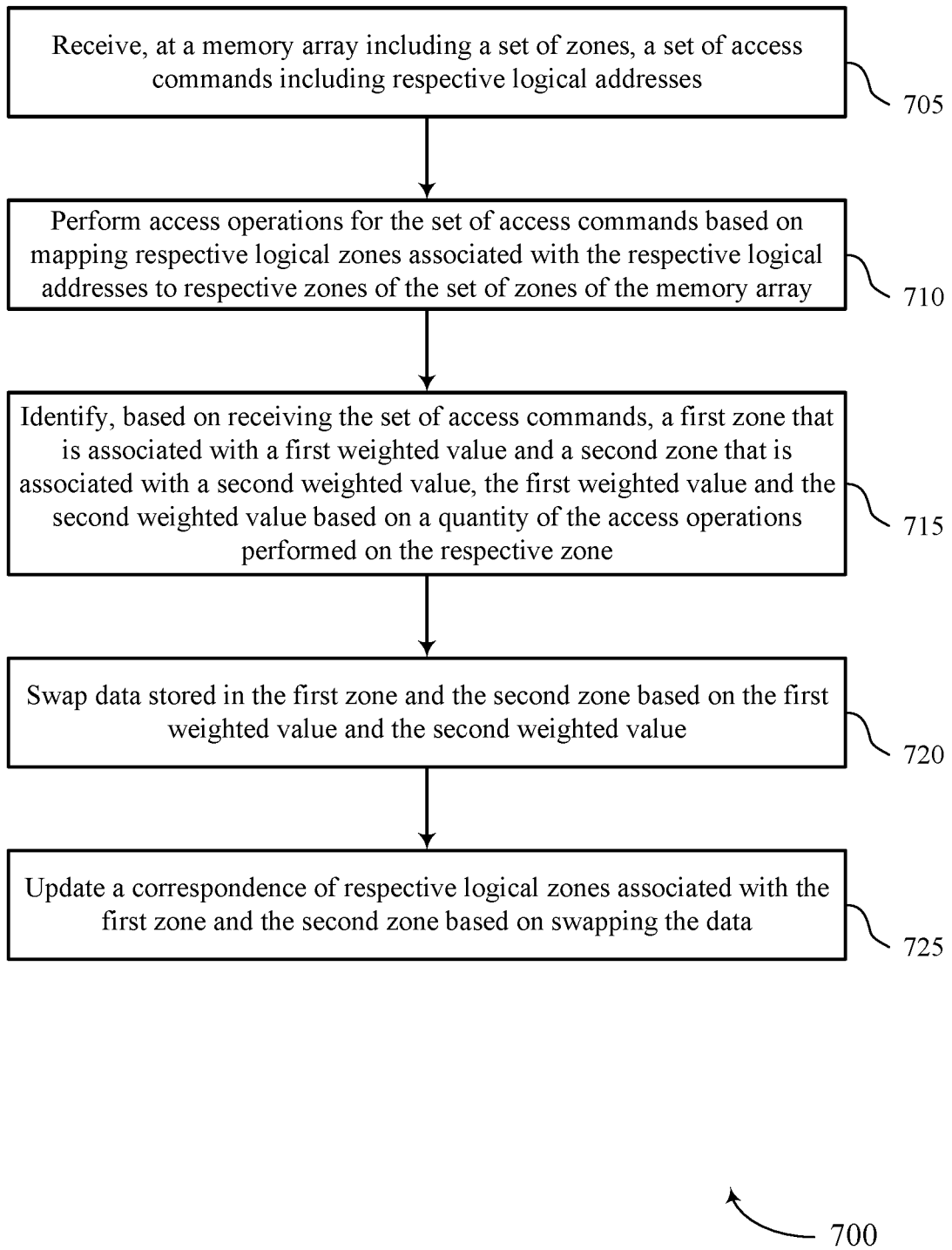
FIGS. 7 through 9 show flowcharts illustrating a method or methods that support zone swapping for wear leveling memory in accordance with examples as disclosed herein.

FIG. 7 shows a flowchart illustrating a method or methods 700 that supports zone swapping for wear leveling memory in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may receive, at a memory array including a set of zones, a set of access commands including respective logical addresses. The operations of 705 may be performed according to the methods described herein. In some examples, aspects of the operations of 705 may be performed by a reception component as described with reference to FIG. 6.

At 710, the memory device may perform access operations for the set of access commands based on mapping respective logical zones associated with the respective logical addresses to respective zones of the set of zones of the memory array. The operations of 710 may be performed according to the methods described herein. In some examples, aspects of the operations of 710 may be performed by an access component as described with reference to FIG. 6.

At 715, the memory device may identify, based on receiving the set of access commands, a first zone that is associated with a first weighted value and a second zone that is associated with a second weighted value, the first weighted value and the second weighted value based on a quantity of the access operations performed on the respective zone. The operations of 715 may be performed according to the methods described herein. In some examples, aspects of the operations of 715 may be performed by an identification component as described with reference to FIG. 6.

At 720, the memory device may swap data stored in the first zone and the second zone based on the first weighted value and the second weighted value. The operations of 720 may be performed according to the methods described herein. In some examples, aspects of the operations of 720 may be performed by a swapping component as described with reference to FIG. 6.

At 725, the memory device may update a correspondence of respective logical zones associated with the first zone and the second zone based on swapping the data. The operations of 725 may be performed according to the methods described herein. In some examples, aspects of the operations of 725 may be performed by a correspondence component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for receiving, at a memory array including a set of zones, a set of access commands including respective logical addresses, performing access operations for the set of access commands based on mapping respective logical zones associated with the respective logical addresses to respective zones of the set of zones of the memory array, identifying, based on receiving the set of access commands, a first zone that is associated with a first weighted value and a second zone that is associated with a second weighted value, the first weighted value and the second weighted value based on a quantity of the access operations performed on the respective zone, swapping data stored in the first zone and the second zone based on the first weighted value and the second weighted value, and updating a correspondence of respective logical zones associated with the first zone and the second zone based on swapping the data.

Some examples of the method 700 and the apparatus described herein may further include operations, features, means, or instructions for determining a weighted value associated with each of the set of zones of the memory array, where identifying the first zone associated with the first weighted value and the second zone associated with the second weighted value may be based on determining the weighted values associated with each of the set of zones of the memory array.

Some examples of the method 700 and the apparatus described herein may further include operations, features, means, or instructions for determining that the first zone may be associated with a greatest weighted value of each of the set of zones and the second zone may be associated with a smallest weighted value of each of the set of zones.

Some examples of the method 700 and the apparatus described herein may further include operations, features, means, or instructions for determining that a difference between the first weighted value and the second weighted value exceeds a threshold value, where swapping the data stored in the first zone and the second zone may be based on the difference between the first weighted value and the second weighted value exceeding the threshold value.

In some examples of the method 700 and the apparatus described herein, updating the correspondence of the respective logical zones associated with the first zone and the second zone may include operations, features, means, or instructions for mapping the logical zone previously associated with the first zone to the second zone, and mapping the logical zone previously associated with the second zone to the first zone.

Some examples of the method 700 and the apparatus described herein may further include operations, features, means, or instructions for prohibiting swapping data in the first zone and the second zone for a duration based on updating the correspondence of the respective logical zones associated with the first zone and the second zone.

In some examples of the method 700 and the apparatus described herein, the duration includes a length of time, a quantity of received access commands associated with the first zone, a quantity of received access commands associated with the second zone, or a combination thereof.

Some examples of the method 700 and the apparatus described herein may further include operations, features, means, or instructions for storing the data to a temporary register of the memory array during the swapping, where the data may be configured to be accessed in the temporary register until the swapping may be complete.

In some examples of the method 700 and the apparatus described herein, each of the set of zones includes a set of code words, the respective weighted value of each zone being updated based on access operations of the set of code words of each of the set of zones.

In some examples of the method 700 and the apparatus described herein, a read operation performed on a code word of a respective zone may be associated with a smaller weighted value than a write operation performed on the respective zone.

In some examples of the method 700 and the apparatus described herein, the first zone includes a greater weighted value than the second zone.

Figure 8:
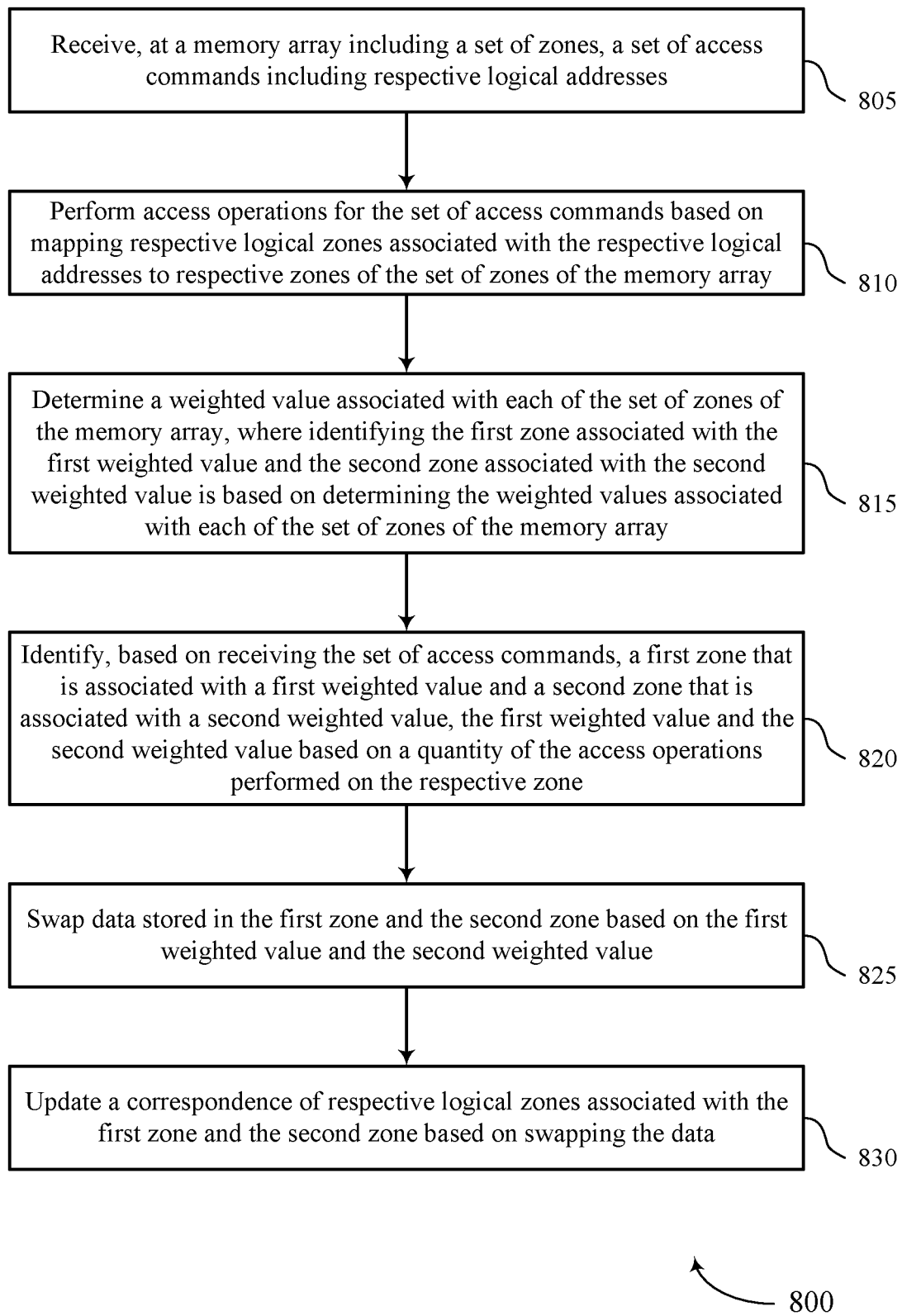

FIG. 8 shows a flowchart illustrating a method or methods 800 that supports zone swapping for wear leveling memory in accordance with aspects of the present disclosure. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may receive, at a memory array including a set of zones, a set of access commands including respective logical addresses. The operations of 805 may be performed according to the methods described herein. In some examples, aspects of the operations of 805 may be performed by a reception component as described with reference to FIG. 6.

At 810, the memory device may perform access operations for the set of access commands based on mapping respective logical zones associated with the respective logical addresses to respective zones of the set of zones of the memory array. The operations of 810 may be performed according to the methods described herein. In some examples, aspects of the operations of 810 may be performed by an access component as described with reference to FIG. 6.

At 815, the memory device may determine a weighted value associated with each of the set of zones of the memory array, where identifying the first zone associated with the first weighted value and the second zone associated with the second weighted value is based on determining the weighted values associated with each of the set of zones of the memory array. The operations of 815 may be performed according to the methods described herein. In some examples, aspects of the operations of 815 may be performed by a determination component as described with reference to FIG. 6.

At 820, the memory device may identify, based on receiving the set of access commands, a first zone that is associated with a first weighted value and a second zone that is associated with a second weighted value, the first weighted value and the second weighted value based on a quantity of the access operations performed on the respective zone. The operations of 820 may be performed according to the methods described herein. In some examples, aspects of the operations of 820 may be performed by an identification component as described with reference to FIG. 6.

At 825, the memory device may swap data stored in the first zone and the second zone based on the first weighted value and the second weighted value. The operations of 825 may be performed according to the methods described herein. In some examples, aspects of the operations of 825 may be performed by a swapping component as described with reference to FIG. 6.

At 830, the memory device may update a correspondence of respective logical zones associated with the first zone and the second zone based on swapping the data. The operations of 830 may be performed according to the methods described herein. In some examples, aspects of the operations of 830 may be performed by a correspondence component as described with reference to FIG. 6.

Figure 9:
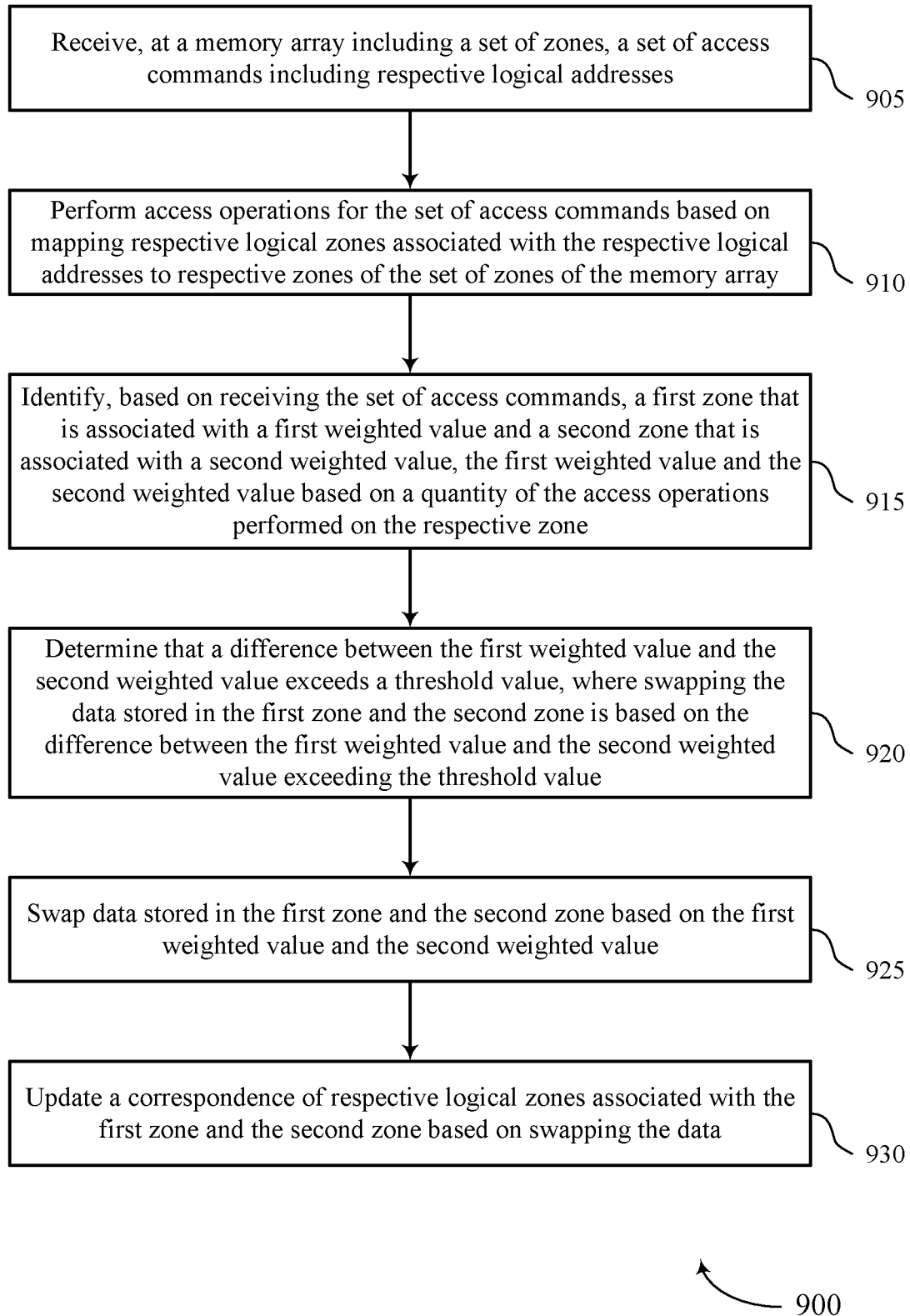

FIG. 9 shows a flowchart illustrating a method or methods 900 that supports zone swapping for wear leveling memory in accordance with aspects of the present disclosure. The operations of method 900 may be implemented by a memory device or its components as described herein. For example, the operations of method 900 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 905, the memory device may receive, at a memory array including a set of zones, a set of access commands including respective logical addresses. The operations of 905 may be performed according to the methods described herein. In some examples, aspects of the operations of 905 may be performed by a reception component as described with reference to FIG. 6.

At 910, the memory device may perform access operations for the set of access commands based on mapping respective logical zones associated with the respective logical addresses to respective zones of the set of zones of the memory array. The operations of 910 may be performed according to the methods described herein. In some examples, aspects of the operations of 910 may be performed by an access component as described with reference to FIG. 6.

At 915, the memory device may identify, based on receiving the set of access commands, a first zone that is associated with a first weighted value and a second zone that is associated with a second weighted value, the first weighted value and the second weighted value based on a quantity of the access operations performed on the respective zone. The operations of 915 may be performed according to the methods described herein. In some examples, aspects of the operations of 915 may be performed by an identification component as described with reference to FIG. 6.

At 920, the memory device may determine that a difference between the first weighted value and the second weighted value exceeds a threshold value, where swapping the data stored in the first zone and the second zone is based on the difference between the first weighted value and the second weighted value exceeding the threshold value. The operations of 920 may be performed according to the methods described herein. In some examples, aspects of the operations of 920 may be performed by a determination component as described with reference to FIG. 6.

At 925, the memory device may swap data stored in the first zone and the second zone based on the first weighted value and the second weighted value. The operations of 925 may be performed according to the methods described herein. In some examples, aspects of the operations of 925 may be performed by a swapping component as described with reference to FIG. 6.

At 930, the memory device may update a correspondence of respective logical zones associated with the first zone and the second zone based on swapping the data. The operations of 930 may be performed according to the methods described herein. In some examples, aspects of the operations of 930 may be performed by a correspondence component as described with reference to FIG. 6.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include an interface configured to receive logical addresses corresponding to one of a set of zones of a memory array, the memory array including a set of zones that are associated with a respective weighted value, a zone translation component coupled with the interface and configured to map received logical addresses to a respective logical zone of the memory array, and a data swapping component coupled with the zone translation component and configured to exchange data stored in respective zones of the memory array based on a weighted value of the respective zones and configured to update a correspondence of respective logical zones associated with the respective zones based on the data swapping component exchanging data.

Some examples may further include determining a weighted value associated with each of the set of zones of the memory array, order the set of zones according to a respective weighted value of each of the set of zones, and identify a first zone including a greatest weighted value and a second zone including a lowest weighted value for exchanging respective data.

In some examples, each zone may include operations, features, means, or instructions for determine a quantity of access operations performed on the set of codewords of each zone, and calculate a weighted value of the set of zones based on the quantity of access operations performed on the set of codewords of each respective zone, where the data swapping component may be configured to order the set of zones based on calculating the weighted value of the set of zones.

In some examples, a weighted value associated with a write operation may be a multiple of a weighted value associated with a read operation.

Some examples may further include identifying a first zone and a second zone which data may have been exchanged, and refrain from swapping data between the first zone and the second zone for a duration after exchanging the data.

In some examples, the duration includes a length of time, a quantity of logical addresses corresponding to the data that may be received by the interface, or a combination thereof.

In some examples, the zone translation component may include operations, features, means, or instructions for update the logical address of respective logical zones based on the data swapping component exchanging data between the respective zones.

An apparatus is described. The apparatus may include a memory array including a set of zones, each zone associated with a weighted value based on a quantity of access operations performed on the respective zone, a memory controller coupled with the memory array, the memory controller configured to, identify a first zone that is associated with a first weighted value and a second zone that is associated with a second weighted value, swap data stored in the first zone and the second zone based on the first weighted value and the second weighted value, and update a correspondence of respective logical zones associated with the first zone and the second zone based on swapping the data.

Some examples may further include determining that a difference in value between the first weighted value and the second weighted value exceeds a threshold value, where swapping the data stored in the first zone and the second zone may be based on the difference in value between the first weighted value and the second weighted value exceeding the threshold value.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    swapping data stored in a first zone and a second zone of a plurality of zones of a memory array, wherein swapping the data is based at least in part on a first weighted value associated with access operations performed on the first zone and a second weighted value associated with access operations performed on the second zone; and
    updating a correspondence of respective addresses associated with the first zone and the second zone based at least in part on swapping the data.

2. The method of claim 1, further comprising:
    modifying a mapping between respective logical addresses and respective physical address of the swapped data, wherein updating the correspondence is based at least in part on modifying the mapping.

3. The method of claim 2, further comprising:
    mapping, to the second zone, a first logical address previously associated with the first zone; and
    mapping, to the first zone, a second logical address previously associated with the second zone, wherein modifying the mapping is based at least in part on mapping the first logical address and the second logical address.

4. The method of claim 1, further comprising:
    receiving, after the data is swapped, an access command to access the data in at least one of the first zone or the second zone based at least in part on a logical address; and
    identifying a physical address corresponding to the logical address based at least in part on updating the correspondence, wherein the data is accessed using the identified physical address.

5. The method of claim 1, wherein the correspondence of the respective addresses is updated using a lookup table that is stored in the memory array.

6. The method of claim 5, wherein the first weighted value and the second weighted value are stored within respective entries of the lookup table.

7. The method of claim 1, wherein:
    the first weighted value is based at least in part on a first quantity of the access operations performed on the first zone; and
    the second weighted value is based at least in part on a second quantity of the access operations performed on the second zone.

8. The method of claim 7, further comprising:
    determining that the first quantity or the second quantity, or both, satisfies a threshold, wherein swapping the data is based at least in part on at least one of the first quantity of the access operations or the second quantity of the access operations satisfying the threshold.

9. The method of claim 1, further comprising:
    determining that the first weighted value comprises a greatest weighted value of respective weighted values associated with the plurality of zones and that the second weighted value comprises a smallest weighted value of the respective weighted values associated with the plurality of zones, wherein swapping the data is based at least in part on the determination.

10. The method of claim 1, further comprising:
    determining that a difference between the first weighted value and the second weighted value satisfies a threshold, wherein swapping the data stored in the first zone and the second zone is based at least in part on the difference satisfying the threshold.

11. The method of claim 1, further comprising:
    refraining, for a duration after swapping the data, from swapping the data in the first zone or the second zone, or both, based at least in part on updating the correspondence.

12. An apparatus, comprising:
    a memory array comprising a plurality of zones;
    a data swapping component coupled with the memory array and configured to swap data stored in a first zone and a second zone of the plurality of zones, wherein swapping the data is based at least in part on a first weighted value associated with access operations performed on the first zone and a second weighted value associated with access operations performed on the second zone; and a mapping component configured to update a correspondence of respective addresses associated with the first zone and the second zone based at least in part on swapping the data.

13. The apparatus of claim 12, wherein the mapping component is further configured to:

modify a mapping between respective logical addresses and respective physical addresses of the swapped data, wherein updating the correspondence is based at least in part on modifying the mapping.

14. The apparatus of claim 13, wherein the mapping component is further configured to:

map, to the second zone, a first logical address previously associated with the first zone; and map, to the first zone, a second logical address previously associated with the second zone, wherein modifying the mapping is based at least in part on mapping the first logical address and the second logical address.

15. The apparatus of claim 12, further comprising:

a memory controller configured to receive, after the data is swapped, an access command to access the data in at least one of the first zone or the second zone based at least in part on a logical address, wherein the mapping component is further configured to:

identify a physical address corresponding to the logical address based at least in part on updating the correspondence, wherein the data is accessed using the identified physical address.

16. The apparatus of claim 12, wherein the correspondence of the respective addresses is updated using a lookup table that is stored at the mapping component.

17. The apparatus of claim 16, wherein the first weighted value and the second weighted value are stored within respective entries of the lookup table.

18. An apparatus, comprising:

a memory array comprising a plurality of zones; and a memory controller coupled with the memory array, the memory controller configured to:

swap data stored in a first zone and a second zone of the plurality of zones, wherein swapping the data is based at least in part on a first weighted value associated with access operations performed on the first zone and a second weighted value associated with access operations performed on the second zone; and update a correspondence of respective addresses associated with the first zone and the second zone based at least in part on swapping the data.

19. The apparatus of claim 18, wherein the memory controller is further configured to:

modify a mapping between respective logical addresses and respective physical address of the swapped data, wherein updating the correspondence is based at least in part on modifying the mapping.

20. The apparatus of claim 18, wherein the memory controller is further configured to:

map, to the second zone, a first logical address previously associated with the first zone; and map, to the first zone, a second logical address previously associated with the second zone, wherein modifying the mapping is based at least in part on mapping the first logical address and the second logical address.

* * * * *